United States Patent
Kohut et al.

(10) Patent No.: US 8,416,017 B2
(45) Date of Patent: Apr. 9, 2013

(54) CIRCUIT AND METHOD FOR REDUCING NOISE IN CLASS D AMPLIFIERS

(75) Inventors: Paul Kohut, Berkeley, CA (US); Peter L. Winship, Berkeley, CA (US); Peter Kowalcyzk, Berkeley, CA (US); Steven Metz, San Francisco, CA (US); Kurt Keown, Fremont, CA (US)

(73) Assignee: Meyer Sound Laboratories, Incorporated, Berkeley, CA (US)

( * ) Notice: Subject to any disclaimer, the term of this patent is extended or adjusted under 35 U.S.C. 154(b) by 0 days.

(21) Appl. No.: 12/907,918

(22) Filed: Oct. 19, 2010

(65) Prior Publication Data

US 2011/0254625 A1 Oct. 20, 2011

Related U.S. Application Data

(60) Provisional application No. 61/253,031, filed on Oct. 19, 2009.

(51) Int. Cl.
*H03F 3/38* (2006.01)
*H03F 3/68* (2006.01)

(52) U.S. Cl. .......................................... 330/10; 330/295

(58) Field of Classification Search .................... 330/10, 330/207 A, 251
See application file for complete search history.

(56) References Cited

U.S. PATENT DOCUMENTS

| | | | |
|---|---|---|---|
| 6,232,833 B1 | 5/2001 | Pullen | |
| 7,196,575 B2 * | 3/2007 | Kim | ................................ 330/10 |
| 2004/0036531 A1 | 2/2004 | Trevelyan | |
| 2007/0075694 A1 | 4/2007 | Xi et al. | |
| 2008/0030270 A1 | 2/2008 | Strydom et al. | |
| 2009/0058549 A1 | 3/2009 | Kost | |

FOREIGN PATENT DOCUMENTS

WO  WO 2011/049997  4/2011

\* cited by examiner

*Primary Examiner* — Robert Pascal
*Assistant Examiner* — Khiem Nguyen
(74) *Attorney, Agent, or Firm* — Beeson Skinner Beverly, LLP (57) ABSTRACT

A circuit for reducing noise in Class D amplifiers has a power stage voltage control means (17, 21, 22) responsive to defined signal conditions of the audio signal input (1). The power stage voltage control means is operative to lower the voltage at the supply voltage input (31) of the amplifier's switching power output stage (30) upon the detection of a defined condition in the audio signal input such that the Class-D amplifier operates at reduced voltage ("idles") during the defined audio input signal condition.

20 Claims, 7 Drawing Sheets

CIRCUIT AND METHOD FOR REDUCING NOISE IN CLASS D AMPLIFIERS

CROSS-REFERENCE TO RELATED APPLICATIONS

The application claims the benefit of U.S. provisional application No. 61/253,031, filed Oct. 19, 2009, which is incorporated herein by reference.

BACKGROUND OF THE INVENTION

The present invention generally relates to audio amplifiers and more particularly to Class D audio amplifiers. The invention is still more particularly directed to the problem of noise in Class D amplifiers. In audio reproduction and reinforcement systems, noise is defined as any sound produced by the system which is not an intentional part of the audio program. Noise is objectionable and particularly noticeable when the audio channel is idle.

Class D audio power amplifiers (switching amplifiers) offer a substantial improvement in efficiency over linear Class AB power amplifiers. Class D amplifiers, however, have drawbacks, which includes higher noise. Class D amplifiers achieve high efficiency only when the output power transistors can be operated in a low loss mode, meaning they are predominantly fully on (saturated state), or fully off, operating like an ideal switch. In practice power loss occurs not only from the resistive loses while the transistor is on but also during the transition state where the transistor is changing from an on or off state. During the transition time there is a high product of voltage and current which produces dissipation in the transistor. Since electrical and physical limitations prevent fast transition of on and off states, the switching (clocking) frequency of Class D amplifiers cannot be too high, particularly at higher voltages and currents needed for higher wattages. In practice, most Class D amplifiers of wattages greater than 50 watts switch at frequencies below 500 kHz.

Class D amplifiers often use modern analog to digital converters (ADCs). Modern high quality audio ADCs utilize sigma-delta conversion with a high degree of oversampling, filtering, and decimating to achieve low quantization noise on their outputs. The pulse width modulator (PWM), which creates the pulses to control the Class D power output transistors, cannot operate at as high degree of oversampling as the ADC, due to the switching speed limitation of the output transistors. This poses a challenge for designing low noise digital PWMs for Class D amplifiers since techniques of oversampling, interpolating, filtering, for noise reduction are more limited compared to ADCs and DACs. Therefore, noise introduced by the digital PWM alone can be significant.

Typically, Class D amplifiers with digital PWMs will achieve 90-110 dB dynamic range, whereas linear Class AB amplifiers can more readily produce 110-120 dB dynamic range. Highest quality digital PWMs for Class D amplifiers offer around 110 dB, but generally that is the upper limit. When low noise audio amplifiers are needed, Class D amplifiers are therefore not favored.

SUMMARY OF INVENTION

The present invention provides a circuit and method for reducing noise in Class D amplifiers that is more effective than the prior art approaches to noise reduction such as herein described. Noise reduction in Class D amplifiers can be achieved at the amplifier stage, that is, downstream of the noise sources, and can be implemented at low cost. The invention works between the and audio input signal and power output of the Class D amplifier to effectively increase its dynamic range and to allow it to be used in more demanding professional applications. In accordance with the invention a means and method are provided for controlling the voltage supply to the switching power output stage of the Class D amplifier in response to defined signal conditions of the audio signal input. Upon detection of and during an "idle" state of the audio signal input, the voltage at the supply voltage input of the amplifier's switching power output stage is reduced. The reduction in the supply voltage of the amplifier's power output stage during idle states of the audio signal input result in a reduction of noise gain during these idle states.

DETAILED DESCRIPTION OF ILLUSTRATED EMBODIMENT

Figure 1:
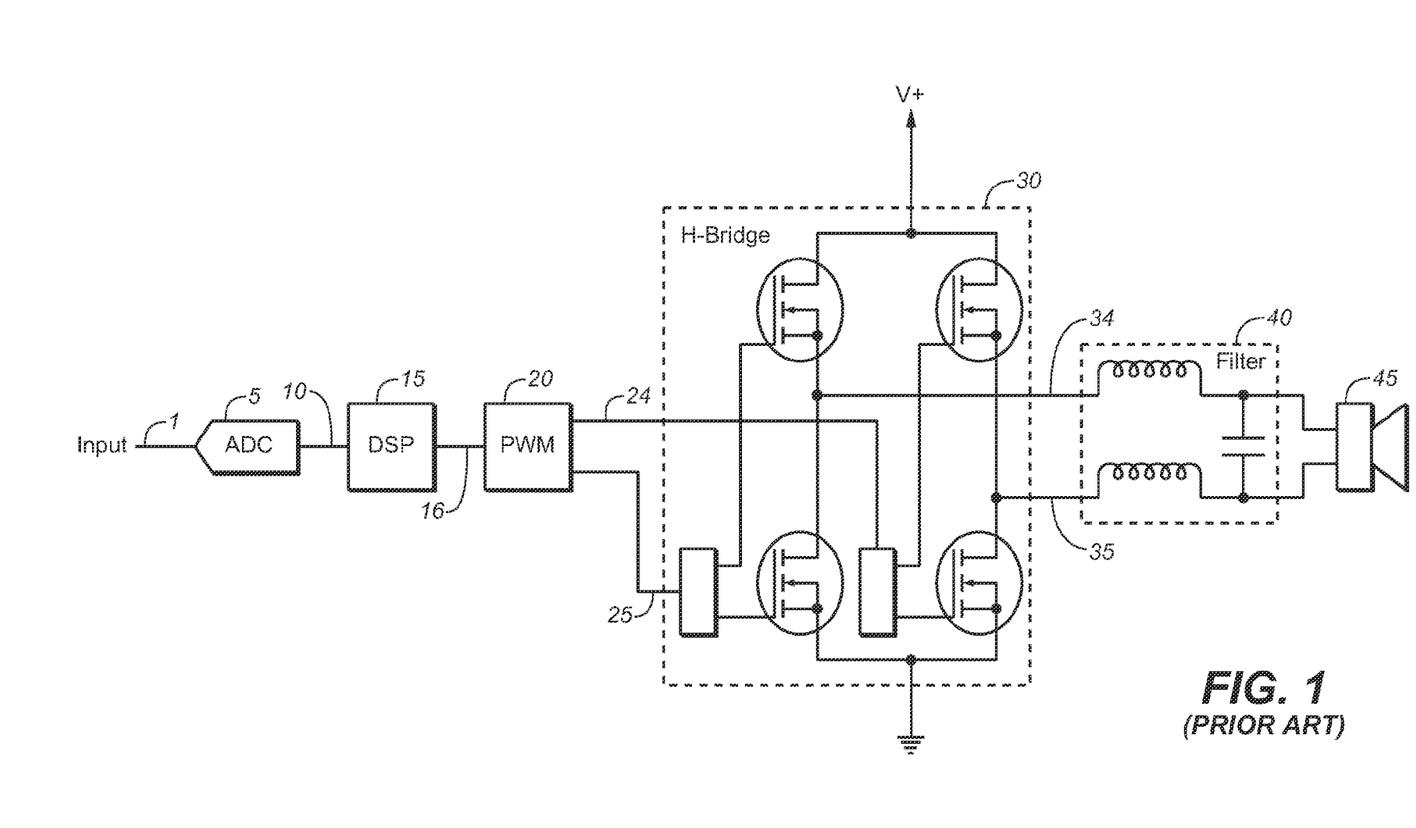
FIG. 1 is a functional block diagram of a basic prior art Class D amplifier, which includes a switching transistor power output stage having a supply voltage input.

FIG. 1 is a block diagram of a modern, prior art Class D audio amplifier, wherein the input 1 is a low voltage analog audio signal. An appropriate analog to digital converter (ADC), represented by block 5, converts the analog signal to a digital signal 10. Typically the ADC produces a digital signal with an effective sample rate (word rate) of 48 kHz or 96 kHz, usually of 24 bit width in modern audio systems. To minimize added noise the ADC is typically an oversampling sigma-delta converter where the quantization noise generated from sampling is spread outside the audio band and filtered to keep the audio noise low. However, ADC (5) introduces noise to the system and depending on its performance may be a limiting factor in the overall dynamic range and noise of the Class D amplifier. A very high quality ADC can exhibit 120 dB dynamic range.

Some Class D amplifiers may have a digital audio input 10 rather than an analog audio input 1. In such cases the analog-to-digital conversion would implemented further upstream in the overall audio system or the audio signal created directly by digital means. In cases where the analog-to-digital conversion is located upstream, or for example a digital recording is used, noise is still produced by the creation of the digital signal.

In many Class D amplifiers a digital signal processor (DSP), represented by block 15, is included to control gain, volume, tone, equalization, etc. While the DSP (15) is not essential to a Class D amplifier's operation it is sometimes combined with the pulse width modulator (PWM), block 20, since both use similar digital logic hardware and can economically be built on the same silicon integrated circuit.

The digital PWM (20) generates varying pulse widths, usually at a fixed frequency, which, when filtered, reproduce the analog audio waveform. The logic level pulses from the PWM are used to switch the power transistors of the switching power output stage 30 on and off. In this case, the switching power output stage is an H-Bridge configuration of power transistors 32. For circuit interface convenience, some modern PWM's provide two identical but opposite phase digital pulse signals 24, 25 to allow an H-Bridge configuration of power transistors to be directly connected and operated.

The PWM (20) introduces noise in the signal due to its quantizing. The PWM usually has smaller dynamic range the than ADC (5) and therefore is the dominant generator of the audible noise floor of the amplifier. High quality commercially available PWM's for Class D amplifiers usually offer only 100-110 dB dynamic range, in contrast to high quality ADC's which offer >110 dB dynamic range. However, if a DSP (15) is implemented in the Class D amplifier, it may, for purposes of audio level control and equalization, be set to add digital gain causing the noise floor of the ADC 5 to exceed that of the PWM (20), further reducing the dynamic range of the amplifier and increasing the noise floor.

The voltage at the two output nodes 34, 35 of the switching power output stage 30, which is an H-bridge configuration of power transistors 32 with voltage level translators represented by blocks 36, is a replica of the opposing logic pulses 24, 25, but at higher voltage and high current capacity to drive a low impedance load at a significant wattage. Next in the signal path of FIG. 1 is the output filter 40. The output filter attenuates frequencies above the audio band so that the speaker load 45 receives only the baseband audio spectrum. The direct output 34, 35 of the H-Bridge power output stage 30 contains a broad spectrum of energy, above and below the Class D switching frequency. The filter is necessary to reduce this energy to prevent RF emissions and additional heat in the loudspeaker load. Once the spectrum is filtered the signal closely resembles the original analog audio waveform. The frequency spectrum of energy directly at the output 34, 35 of the H-Bridge power output stage is understood by common discrete time sampling theory.

The outputs 34, 35 of the H-Bridge power output stage 30 switch between high voltage (determined by the main voltage supply V+, sometimes called "rail" voltage) and ground. Due to resistive loses in the switching transistors, the outputs 34, 35 are slightly less than V+ and higher than ground. The loss is generally small, typically less than 1 V, and is affected by the load impedance. Therefore the peak voltage at either node (34 or 35) is proportional to V+. Similarly the output voltage after the filter 40 is also proportional to V+. Therefore the voltage gain of the entire amplifier depicted in FIG. 1 is a function of V+.

Some Class D amplifiers generate the PWM signal directly at the input stage by using a ramp generator and comparator. These designs effectively combine the blocks 5 and 20 shown in FIG. 1.

As indicated above, in the Class D amplifier shown in FIG. 1, the noise which is produced by the amplifier and applied to the loudspeaker occurs from two main sources: the ADC 5 (and its associated input circuit), and the PWM (20). The quality and complexity of those circuits determines the noise floor of the amplifier. The noise floor is sometimes worsened when digital gain is applied in the DSP (15) since it increases the noise generated by the ADC.

Because noise is a well known limitation of Class D amplifiers, some Class D amplifier designs include a dynamic muting function in the DSP (15). However, this approach produces objectionable audible artifacts and has limited use. Muting the audio in the DSP cannot eliminate noise generated in the PWM. Another known approach to mitigating the problem of noise in Class D amplifiers is to suspend the modulation in the PWM by the DSP dynamically, effectively shutting off the PWM and muting the output. This approach has similar drawbacks. Stopping and restarting the PWM produces the same objectionable audible artifacts.

Figure 2:
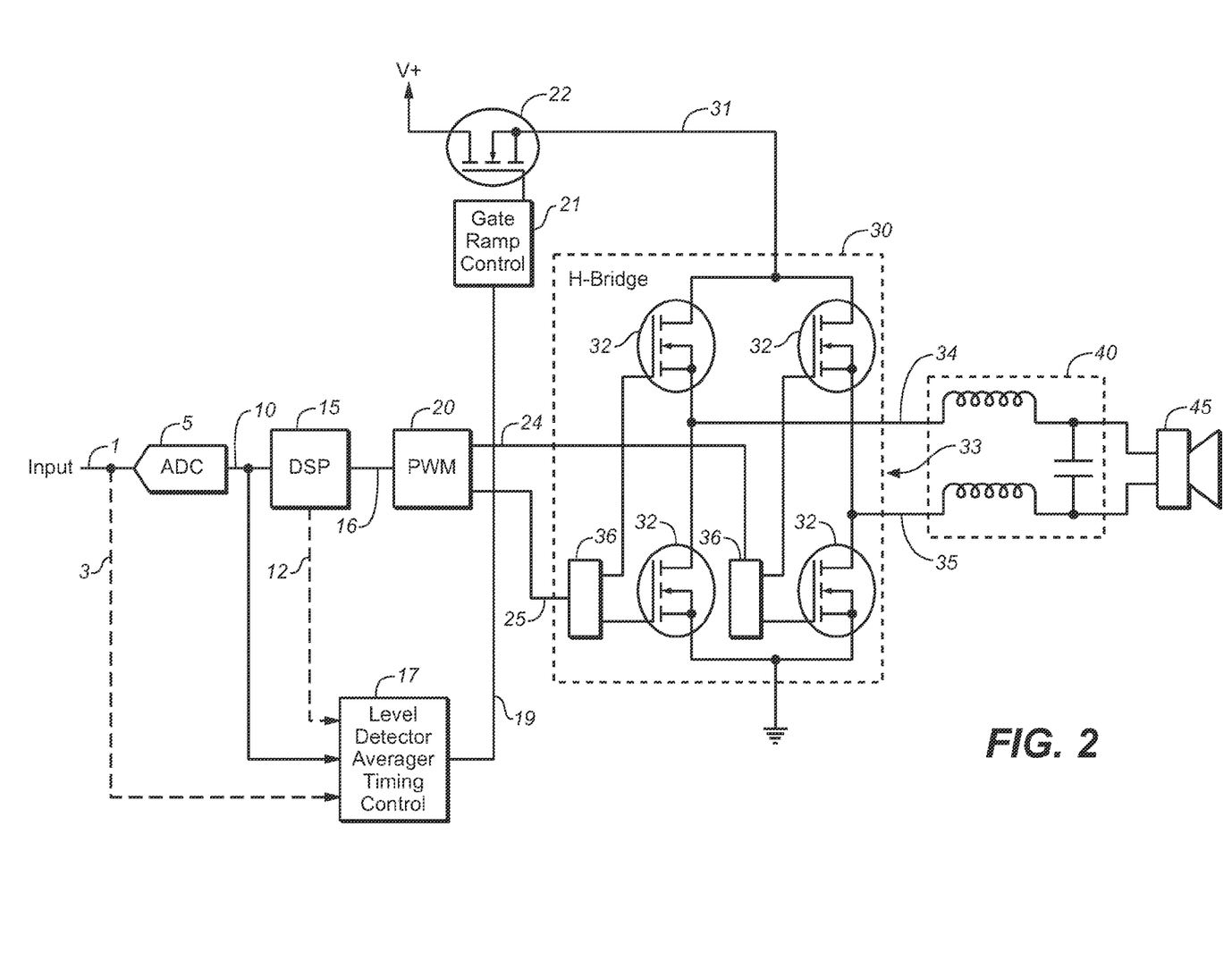
FIG. 2 is a functional block diagram of a Class D amplifier in accordance with the invention, which includes a power output stage voltage control means responsive to defined signal conditions of an audio signal input.
Figure 3:
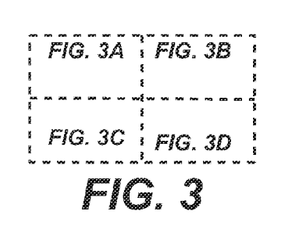
FIGS. 3A, 3B, 3C 3D are more detailed circuit diagram of the Class D amplifier shown in block diagram form in FIG. 2.
Figure 3A:
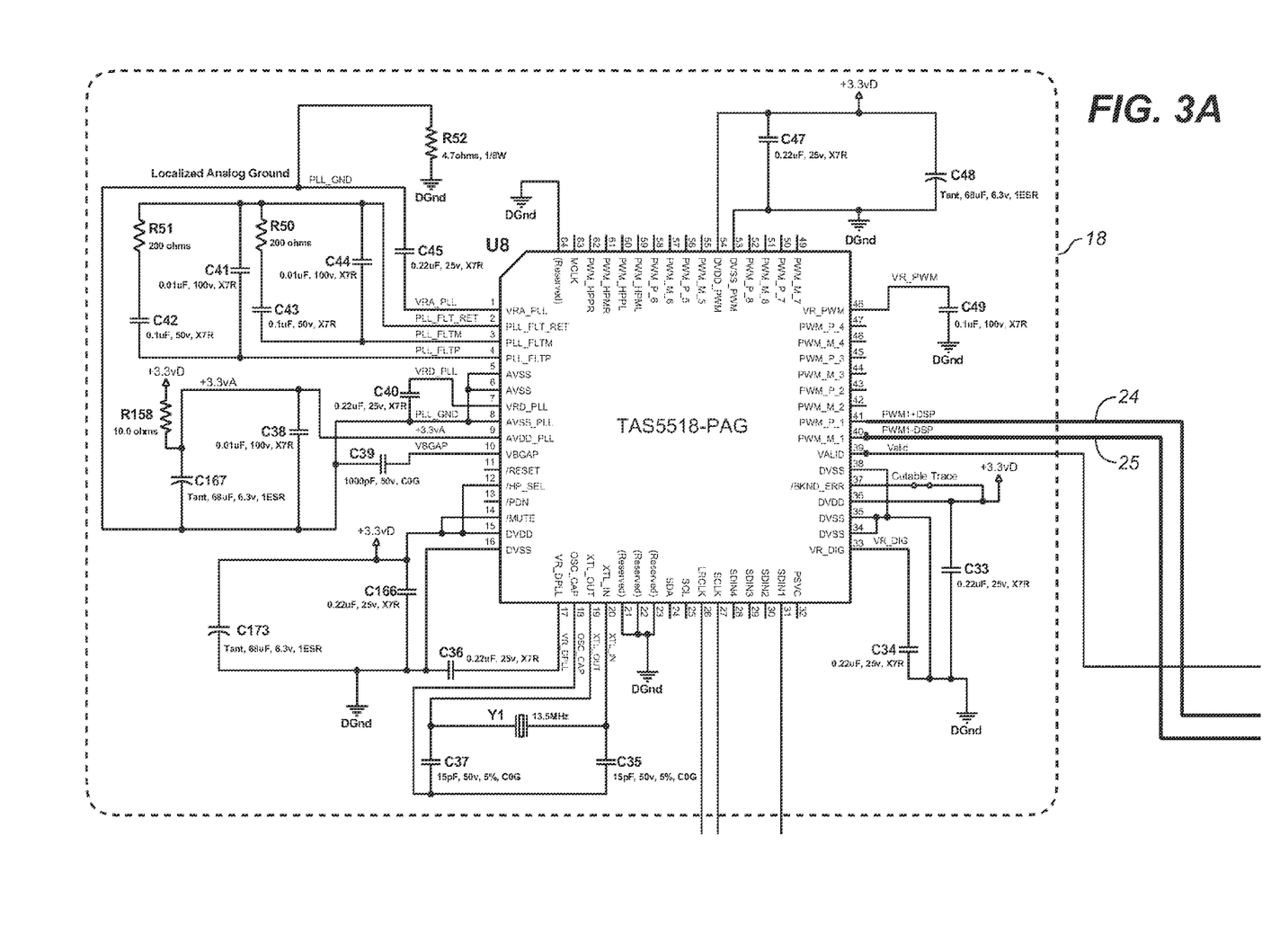
Figure 3B:
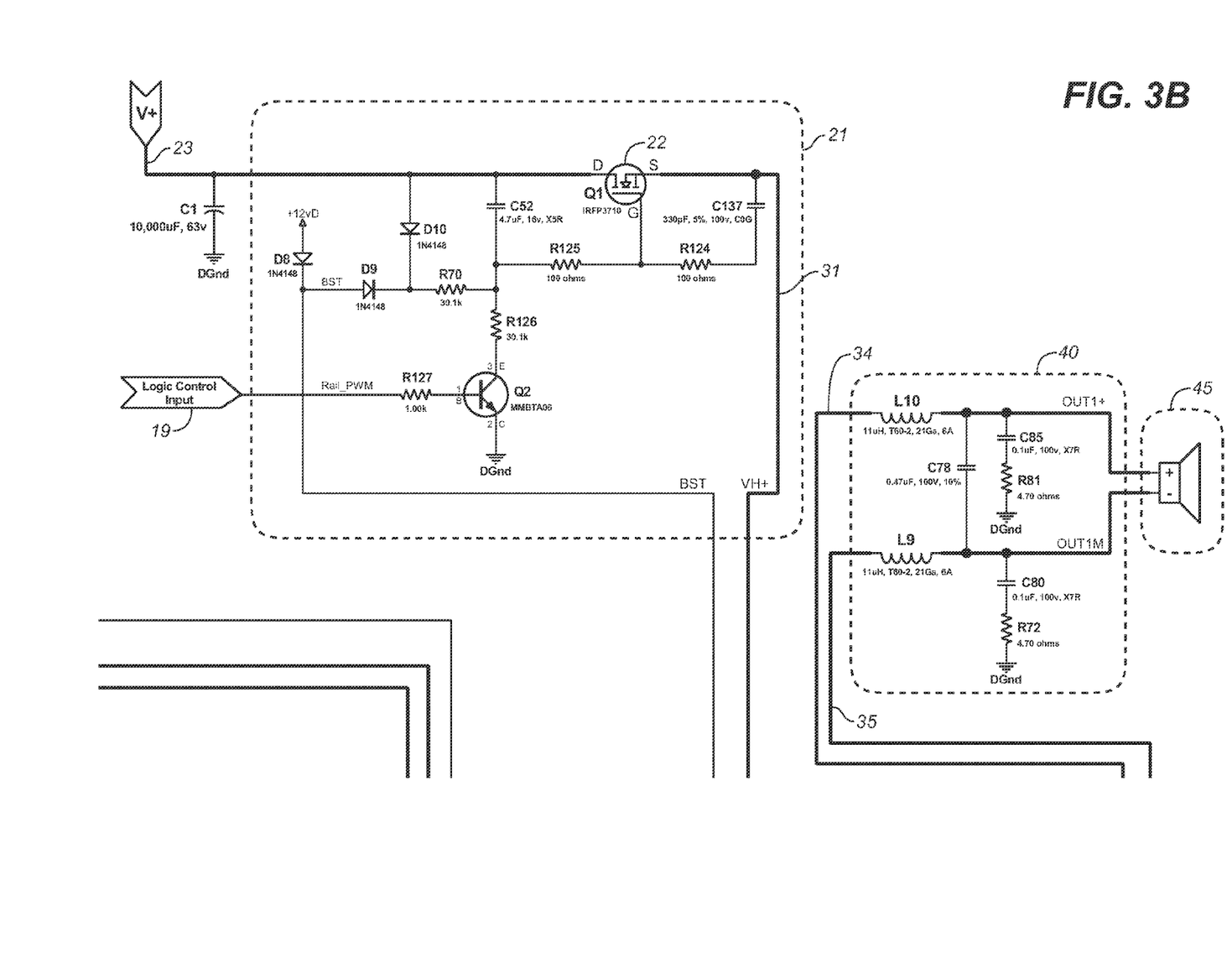
Figure 3C:
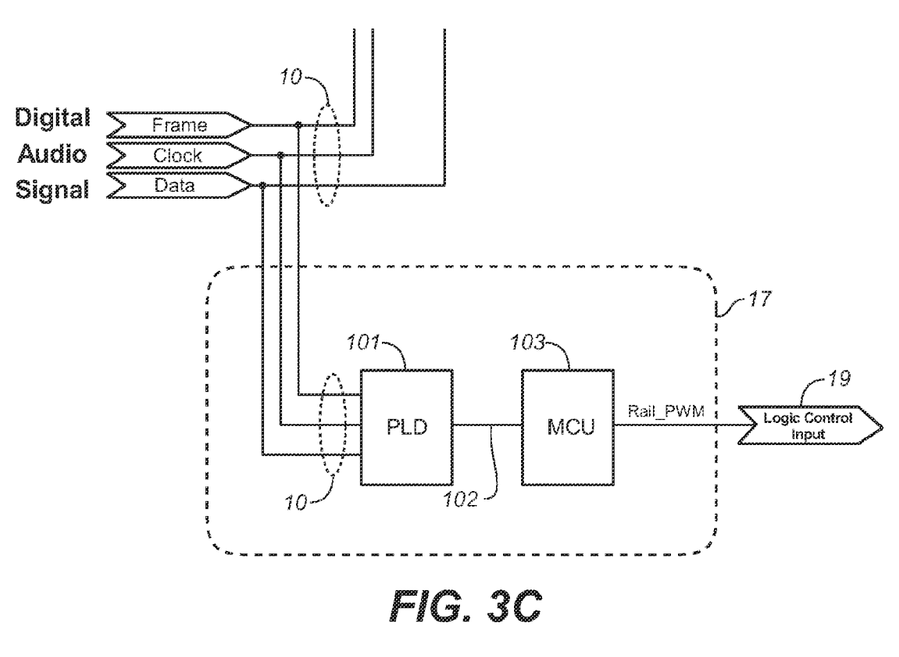
Figure 3D:
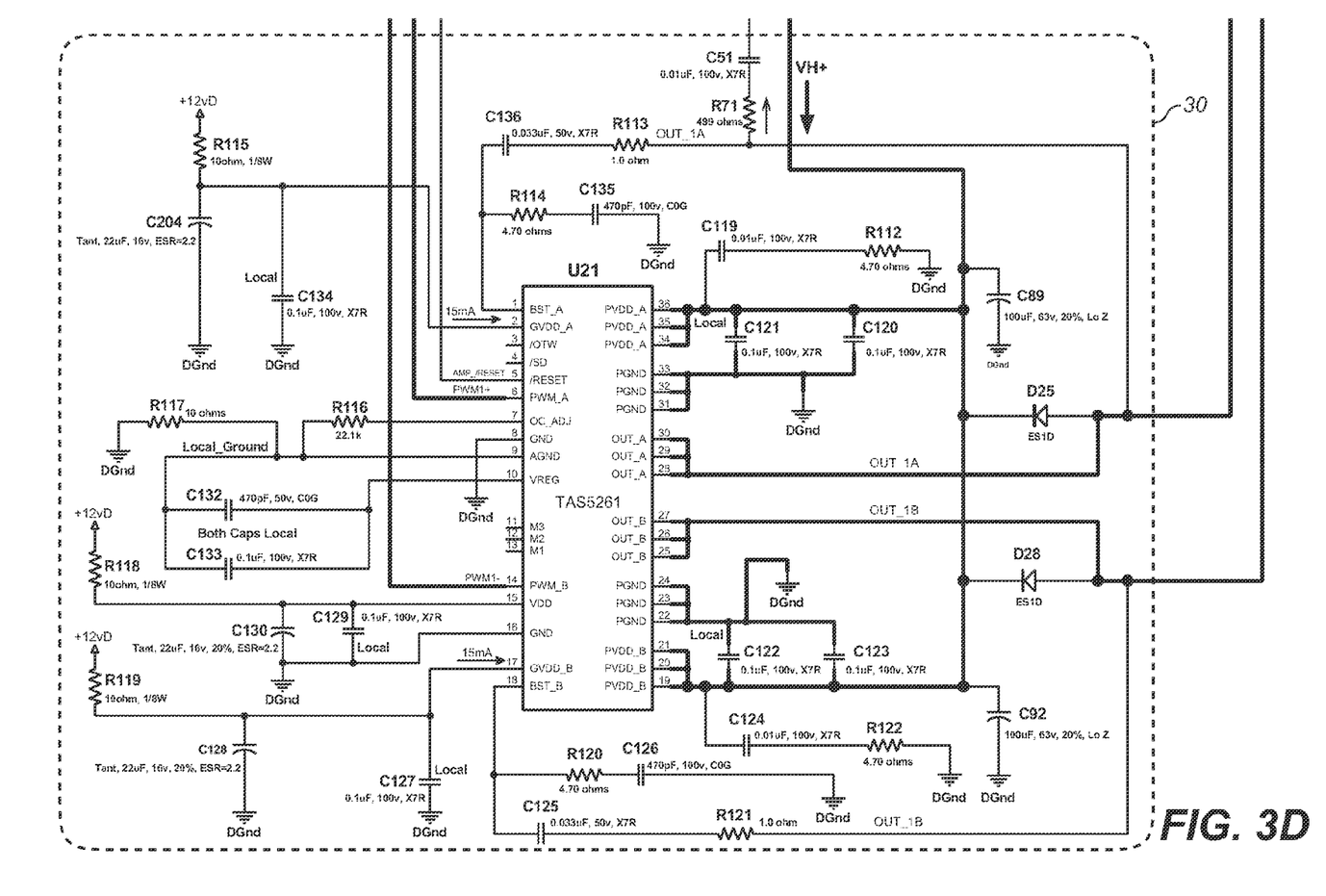

FIG. 2 is a block diagram of a Class D amplifier in accordance with the invention for reducing the noise in Class D amplifiers. Here, circuitry has been added to the basic Class D design shown in FIG. 1 to achieve a greater degree of noise reduction than has heretofore been achieved. As hereinafter described, this circuitry automatically controls the voltage supplied to the switching power output stage of the amplifier in response to the presence of an audio input signal.

Referring to FIG. 2, the basic circuit components of a Class D audio amplifier in accordance with the invention include the pulse width modulator (PWM), represented by block 20, and a switching power output stage 30 having a pulse power output 33. It also preferably includes an output filter stage 40 for filtering the pulse power output from the power output stage 30 to produce an amplified analog audio signal for driving an acoustical transducer. However, it shall be understood that an output filter stage is not required. It would be possible to drive the transducers without filtering the pulse power output from the power output stage. In this illustrated best mode, a digital PWM (blocks 15 and 20) is also employed requiring the addition of the analog to digital converter (ADC) represented by block 5. However, it is not intended that the invention be limited to Class D amplifiers employing a digital PWM. Furthermore, while the switching power output stage 30 is shown in the illustrated best mode as an H-Bridge configuration of switching power output transistors 32, it is not intended that the invention be limited to such a switching power output circuit configuration.

In accordance with the invention, a power output stage voltage control means in provided which responsive to the signal level of the audio signal input 1 for controlling the voltage applied to the switching transistor power output stage 30 ("supply voltage"). In the illustrated embodiment, the power output stage voltage control means includes a power control transistor 22 added into the path between the main voltage supply or rail voltage V+ and the H-Bridge power output stage 30 of the illustrated Class D amplifier circuit. The output 31 of the power control transistor provides the supply voltage to the power output stage 30, and is controlled by gate ramp control circuit 21. When the gate ramp control circuit lowers the power output stage supply voltage, it reduces the multiple sources of noise generated in the amplifier, primarily by means of reducing gain after the PWM (20). For simple control and low cost, power control transistor 22 is suitably an N-channel MOSFET operated as a voltage follower.

The gate ramp control 21 generates a specific gate voltage (applied to the gate of MOSFET transistor 22) and a rate of change of the gate voltage. The gate voltage and rate of change of the gate voltage for the power control transistor preferably causes the power control transistor to achieve the following:

1) Suitably fast reduction in supply voltage at control transistor output 31 for rapid control but inaudible transition, i.e. no clicks or noises heard in speaker.
2) Suitable speed of increase in supply voltage to minimize heat dissipation in the power control transistor 22 and to minimize surge current in storage capacitors connected to output 31.
3) Suitable speed of supply voltage increase to allow inaudible gain transition.
4) Boost supply voltage higher than V+ to turn MOSFET transistor 22 fully on so that output 31 is essentially the same voltage as V+

5) A minimum preset voltage at output 31.
6) Logic level control input 19 to initiate high or low voltage at 31, or to alternatively set intermediate voltages at 31 by receiving fast pulses of varying width.

The illustrated implementation of the power output stage voltage control means further includes a audio input level detector circuit 17 for producing a logic level control input 19 for the for gate ramp control circuit 21. The level detector circuit 17 is preferably comprised of a level detector and related timing and averaging circuits. The level detector may operate from either the digital audio input signal 10, the analog input signal 3, or an equalized, filtered, processed signal 12 from a digital signal processor 15. The function of the level detector circuit is to monitor input audio levels and, when sufficiently low and determined to be in an idle state, apply a change to the logic level control input 19 to initiate a reduction in voltage applied to the H-bridge power output stage 30 through the gate ramp control circuit 21 and power control transistor 20.

The illustrated circuit operates by first detecting when the audio input level to the amplifier is sufficiently low (set by a threshold empirically). Then it reduces the supply voltage and consequent output gain smoothly within the amplifier power output stage 30 to reduce the noise at the amplifier output. The reduction in supply voltage and consequent output gain is achieved while the amplifier is idling without audio passages, which is when noise is audibly noticed. Since the output gain is lowered, but not reduced to zero or muted, when an audio signal resumes the initial starting edge of the waveform is maximally preserved and full supply voltage, and full gain, are rapidly and smoothly restored by the control circuits so that the restoration of the voltage and gain is generally undetectable.

It is noted that the illustrated Class D amplifier circuit is an open loop circuit wherein lowering the supply voltage at 31 to the H-bridge power output stage 30 lowers the overall gain of the amplifier. However, it is contemplated that a Class D amplifier in accordance with the invention could be implemented in a closed loop circuit configuration. In a closed loop implementation, lowering the supply voltage for the switching power output stage lowers the gain of the power output stage (and noise gain), but would not, due to system feedback, lower the overall amplifier gain.

The noise reduction circuit of the invention could be implemented by circuits other than described and illustrated herein. However, generally it is contemplated that the circuit will include the following:

An input threshold that is empirically set slightly above the noise floor of the audio input circuits or ADC;
A delay of several seconds prior to activating a reduction in voltage at the amplifier power section;
A rapid detection (suitably less than 1 ms) and trigger of the presence of input audio signal when the audio signal resumes;
A reduction in voltage corresponding to 20%-50% of the full supply voltage (yielding a noise reduction of 6-14 dB) during an idle state;
A rate of 50-100 milliseconds to reduce voltage.
A rate of 100-200 milliseconds to increase voltage.

FIG. 3 shows an exemplary circuit implementation of the circuit illustrated in FIG. 2. Several of the enclosed circuits 18, 30, 40 are based on commercially available integrated circuits (IC) and recommended circuit connections by the IC manufacturer. Circuit block 18 depicts a circuit that combines the PWM and DSP for the Class D Amplifier which was shown in block diagram form in blocks 15 & 20 of FIG. 2. In FIG. 3, block 18 contains a digital integrated circuit, U8 (part number TAS5518), and passive circuit components recommended by its manufacturer Texas Instruments. U8 is a programmable device where various DSP functions are available for audio processing, control and routing. U8 allows four stereo inputs and provides eight channels of PWM for Class D amplifier power stages. Circuit block 18 receives a serial digital audio input signal (10) from a suitable analog to digital converter (ADC). The serial digital signal (10) has a 48 kHz effective sample rate. It is in the industry format of I$^2$S with the serial data coded in two's compliment. The digital audio signal is applied to channel 1 of U8 (SDIN1). With internal signal processing programmed appropriately inside the TAS5518 as recommended by the manufacturer, a differential PWM signal is outputted at nodes 24 and 25. The differential PWM signal is applied to the H-Bridge power output stage represented by block 30.

The detailed circuit contained in the H-bridge power output stage, block 30, is recommended by the manufacturer of the H-Bridge integrated circuit PN TAS5261 commercially available from Texas Instruments. The H-Bridge circuit 30 receives a PWM signal from nodes 24, 25 of the PWM stage output and outputs a replica of those PWM signals at a higher voltage and current at output nodes 34, 35 at the output 31 of the power output stage.

The switching outputs at nodes 34, 35 are applied to an output filter 40. The output filter is a second order low pass filter with a cutoff frequency of 70 kHz. Inductors L9 and L10, and capacitor C78 are of appropriate current rating and construction as recommended by the manufacturer of the TAS5261 to handle the power produced by the Class D amplifier. The output of the filter is connected to a loudspeaker 45.

The H-Bridge 30 is supplied with its main power supply voltage through node 31, referred to herein as VH+. The main power supply voltage, VH+, is provided by the source lead of the power transistor 22 depicted within the gate ramp control circuit block 21. The main voltage or rail voltage V+ (23) for the amplifier is applied to the source lead of power control transistor 22. In the illustrated embodiment, V+ (the rail voltage) can be fixed, and selected to be between 30 to 50 VDC. In order to provide high current peaks the main V+ voltage rail can include a large storage capacitor C1. The conductor paths are suitably low impedance through the path of V+ to the H Bridge IC (U21), as would be accomplished with close proximity on a printed circuit board using a copper power plane. The remaining circuitry shown in circuit block 21 controls the gate lead of the power transistor 22.

If logic control input 19 is in the low state (<0.5 VDC), Q2 remains off and initially at power-on of the system voltage is provided to the gate lead of Q1 from D10 passing through R70 and R125. During initial power-on of the system the gate lead will have the same voltage as V+ minus the small loss through D10. Since the gate to source turn-on threshold (VG-Sth) of Q1 is approximately 3V, the voltage at the source lead, node 31, will be approximately 4 volts lower than V+. Once the H-Bridge outputs begin to switch between ground voltage and VH+, the gate lead of Q1 will increase to about 10V more than V+. The increase occurs due to the charge developed in C1 when node 34 is at ground state by means of current flowing from +12 VD through D8 and R71. As node 31 switches to the VH+ state, the charge on C51 causes BST to swing higher than V+, thus causing D9 to conduct and charge C52 so that the voltage at the junction of R70 and R125 rises to 10V above V+. Several switching cycles on the H-Bridge output 34 are required to bring C52 to its final charge since the charge is being transferred from C51. The gate lead of Q1 is also brought to an increased voltage since there is no voltage drop on R125. The increased voltage at the gate lead of Q1 causes Q1 to be turned-on fully so that VH+ is at the same potential as V+ except for a small loss due to the on-resistance (which is suitably 23 milliohms).

During normal operation of the amplifier, when audio signals are present, Q1 is kept in the full-on state. The introduction of Q1 into the power supply path to the H-Bridge IC would normally cause deterioration in audio performance, particularly THD. In the present invention the specific characteristics of MOSFET Q1 operating in the full-on state, and the use of capacitors C90 and C92 local to the H-Bridge, allows the THD performance of the Class D amplifier to remain nearly unaffected. Capacitance less than 100 uF on VH+ exhibits higher THD. Capacitance greater than 300 uF on VH+ causes complications with ramping Q1. It is noted that circuit elements R124 and C137 shown in FIG. 3 in the gate ramp control circuit 21 (to the right of the MOSFET Q1) are provided in order to prevent spurious oscillation in the MOSFET and to keep the MOSFET stable during ramping.

If the gate ramp control 21 receives a high state (>2V) from the logic control input 19, Q2 turns on and charges C52 in the opposite direction through R126. The charge takes about 50-100 ms, due to the time constant associated with R70, R126, and C52. The final voltage at the junction of R70 and R125 is approximately V2 of V+. This voltage can be adjusted by adjusting R126 through simple calculation, and is selected by observing the degree of noise reduction needed from the amplifier when it is in the idle state with no audio passing and control logic input high.

When control logic input 19 is high the voltage reduction at the junction of R70 and R125 is also applied to the gate lead of Q1. This causes a smooth voltage reduction in VH+. The duration and exponential slope that occurs at the junction of R70 and R125 when the control logic input is switched high provides a smooth change in gain and noise and does not introduce clicks or artifacts once the audio signal has dropped below the intended input threshold.

When the control logic input is switched back to the low state, Q2 turns off and lower leg of C52 rises back to 10 volts above V+ along with the gate lead of Q1. The increase in voltage takes approximately 100-200 ms due to the time constant associated with R70 and C52. The exponential rise of the gate voltage and its duration is believed to be important to the performance of the invention. It has been observed the gate voltage must rise sufficiently fast to restore amplifier gain, thereby minimizing affects on the resuming audio waveform, and restore peak voltage and power availability. However, the rise in voltage must also be smooth as to not cause clicks and artifacts or produce substantial power dissipation in Q1, C89, and C92.

While not provided in the illustrated embodiment of the level detector (block 17 in FIG. 2), it is anticipated that the control logic input 19 may also be fed with pulses to set a different voltage at the gate lead of Q1, or change the ramp characteristics in the increasing or decreasing voltage. The pulse width and frequency will determine the voltage at the gate lead taking into account the circuit component values. The pulse frequency should be >300 Hz to allow C52 to average the voltage without significant ripple, which would otherwise be audible at the amplifier output. The use of different voltages and ramp speeds may be beneficial with particular types of audio signals to enhance performance of the noise reduction when entering into and out of idle or low level passages.

Audio Level Detector & Signal-State Decision

As above-mentioned, an important aspect of the present invention is the inclusion of the level detector circuit represented by block 17 in FIG. 2. The level detector circuit provides a means to detect the condition of the audio signal input, and particular the audio signal level, in order to accurately estimate when the audio program is present or not, that is, whether the audio channel is idle. The operation of the level detector circuit will now be described in greater detail.

The term "level" in "level detector" shall mean a suitably averaged measure of the magnitude of the audio signal. The level detector monitors the level of the audio signal and when the level drops below a sufficiently low threshold $L_1$, the signal-idle condition is declared, and the gain of the Class D output is reduced. When the level again rises above $L_1$, the signal-active condition is declared, and the gain is restored to normal. The design of the level detector circuit involves the following design considerations and parameters:

Audio Noise Floor—A noise floor of the audio signal at the detector input is assumed. This is not the idle channel noise of the Class D amplifier. Rather, it is any noise that accompanies the audio signal at the level detector input, and usually is at a more-or-less constant level, regardless of the level of the audio program signal itself. If the noise floor at the detector input is higher than the minimum level of program audio that is required to pass through unaffected, then it may not be possible to accurately discriminate between idle and active signal states; there would be no threshold $L_1$ that lies below the minimum audio level and above the noise floor. In the following description, a sufficiently low noise floor is assumed.

Audio Signal Source—In a typical audio system, there are many choices of a signal source for the level detector along the signal path from input to output. The choice is influenced by many factors, among which are the noise floor as described, implementation convenience and cost, or any of a number of other considerations, e.g., it may be desirable to restrict the frequency band of the signal fed to the level detector for perceptual reasons. The behavioral details of the level detector are determined mainly by perceptual and usability considerations with audio program material.

Thresholds—Two thresholds $L_{on}$ and $L_{off}$ are used to provide some hysteresis between signal states. When the signal falls below $L_{off}$, the idle state is declared, and when rising above $L_{on}$, the signal active state is declared. This hysteresis action prevents the detector from switching signal state when the level is close to a single threshold.

Pauses—Allowance should be made for brief pauses in the audio, which occur frequently in speech and music, so that the audio can be heard in a natural way, without noticeable gain switching. The channel should be declared idle only if the signal has been absent for some seconds. To this end, the signal idle state is declared only if the level has remained below $L_{off}$ for a specified duration, typically a few seconds. In the signal-idle state, gain is lowered. Upon resumption of audio, full gain should be restored in the audio path as early as possible to avoid any perception of "switching on".

Smooth Transitions—In addition to accounting for audio pauses, gain should be varied smoothly to prevent sudden transitions in noise level, which would be noticed and therefore objectionable. In the current embodiment of the invention, this smoothing is accomplished in the gain switch itself as herein described.

Averaging—The level of the audio signal can be defined in many different ways, all of which require some degree of time-averaging, since the instantaneous signal (voltage or sample values) can move rapidly between very large and very small magnitudes, all the while being perceived to be at a constant level. Averaging is done by lowpass-filtering the instantaneous signal magnitude. The requirements for the filter's time constant are two-fold: To i) smooth the gross fluctuations in magnitude and ii) in a discrete-time implementation, to allow sample rate reduction in order to reduce computational speed requirements. It should be noted that as the hysteresis thresholds lie closer to each other, the larger the filter time constant should be in order to prevent short-term fluctuations from causing false state transitions.

An implementation of the level detector is shown in FIG. 2 wherein the level detector is represented by block 17. The audio signal source is the ADC digital output 10. The level detector's output is the signal state decision, which appears as a single logic signal 19 that is fed to the gain control circuit comprised of gate ramp control block 21 and power control transistor (FET) 22. The gate ramp control circuit 21 provides smooth gain transitions as mentioned above. The FET 22 is used to adjust the supply voltage fed to the H-bridge output stage 30 which in turn has the effect of varying the gain of the signal appearing at the transducer 45.

Figure 4:
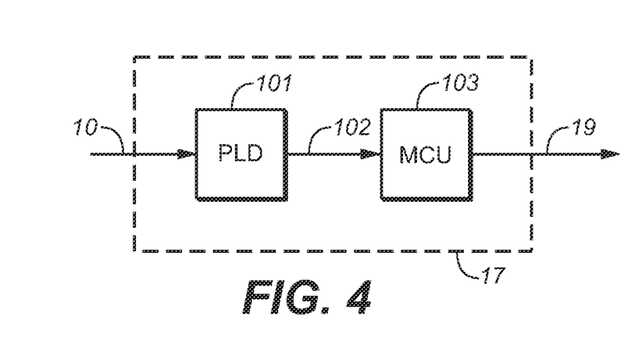
FIG. 4 is a functional block diagram of the level detector circuit thereof.

An exemplary implementation of the level detector 17 can be implemented in digital hardware as generally shown in FIG. 4. Referring to FIG. 4, it is seen that the signal output 10 from the ADC 5 is fed to a custom-programmed logic device 101 (PLD). The PLD 101 performs initial processing. The signal 10 is a digital version of the incoming audio signal input 1 and is suitably sampled at 48 kilosamples per second (ks/s). This signal is lowpass filtered and reduced in sample rate ("decimated") to a rate of 3 ks/s by the PLD 101. The reduced-rate output 102 is fed to a commercially available microcontroller unit (MCU) 103. The MCU performs the remainder of the level detector algorithm in firmware code, and presents a binary state decision, signal-active or signal-idle, at a digital output 19. The gate ramp control 21 uses this information to control the supply voltage 31 for the power output stage 30.

Commercially-available microcontrollers include one or more PWM outputs, which are not usable for high-quality audio; however, they can be used to create an analog gain control signal. The gate ramp control 21 and its accompanying FET 22 can be driven by a PWM output of the MCU to allow output level control over the full range of gain. In addition, the gate ramp profile can be determined by the MCU's PWM output to tailor the gain transitions as desired.

Figure 5:
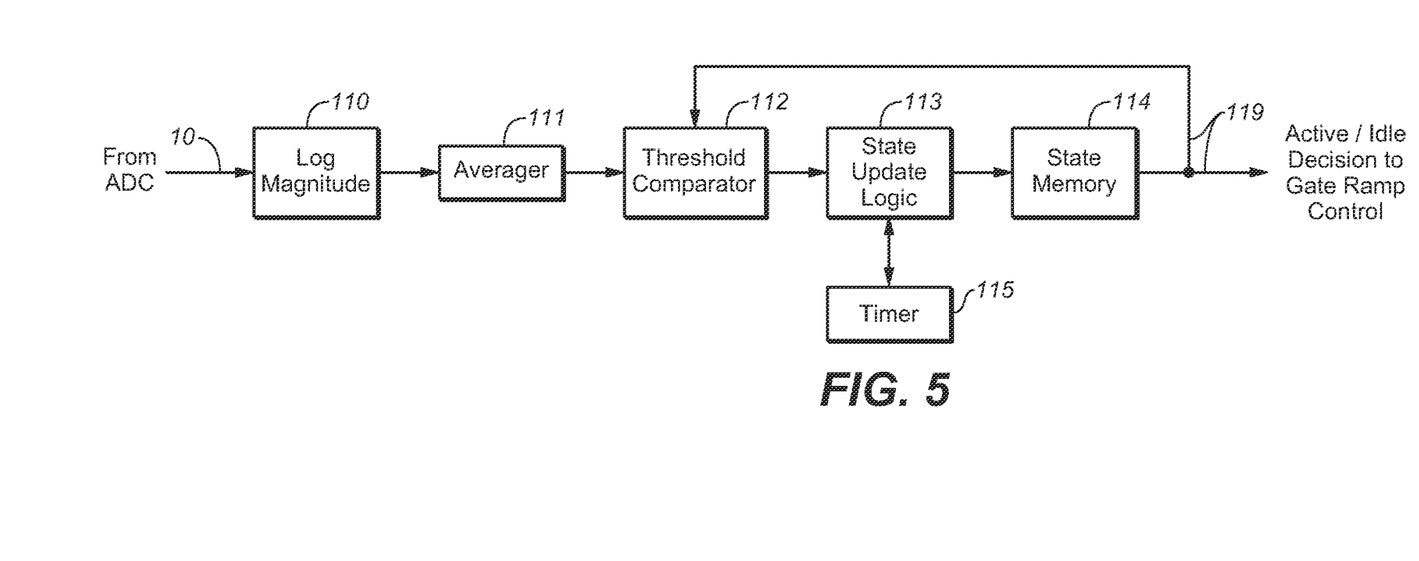
FIG. 5 is an expanded functional block diagram of the level detector.

Next, the functions of the level detector are described without reference to the physical hardware used. FIG. 5 shows the major functional blocks of the algorithm. The source signal 10 is fed to a log magnitude calculation block 110 that provides an output that is approximately equal to a scaled logarithm of the absolute value of the signal. Use of the logarithm is not essential to this algorithm, but it is advantageous and convenient to implement.

The signal from the log magnitude block is fed to an averager 111 that has the effect of lowpass filtering the rapidly fluctuating input level to a much more slowly varying average level. This has the effect of roughly approximating the human perception of "level".

The output of the averager is fed to the threshold comparator 112, which compares its input to one of two thresholds as described above. The choice of comparison threshold is governed by the currently-held state decision, as shown by the signal 19, which is fed back to the threshold comparator 112. The output of the threshold comparator is a signal that indicates a threshold crossing event to the following block 113.

Upon a signal-rising threshold crossing event, the state update logic block 113 will immediately indicate a signal-active condition to the state memory block 114 and take no further action. On a signal-falling threshold crossing event, the state update logic block 113 does not pass the event on to the state memory. Instead, it applies a start signal to the timer block 115. The timer 115 responds by entering a wait state, which is held for a fixed period of time after which the timer returns to the idle state.

The timer state is indicated back to the state update logic, which continuously monitors the status of the threshold comparator output and the timer wait state signal. If the timer returns to the idle state before there are any signal-rising threshold crossings, the state update logic indicates a signal-idle state to the following state memory block 114. If there is a signal-rising threshold crossing event while the timer is in the wait state, the state update logic turns the timer off and takes no further action, which has the effect of leaving the state memory block in the signal-active state.

The state memory block 114 maintains the signal state sends an indication of its state back to the threshold comparator 112 and out to the gate ramp control 21 of FIG. 2, via signal 19.

While an illustrated embodiment of the invention has been described in detail above, it will be appreciated and evident to persons skilled in the art that variations of the invention are possible that fall within the spirit and scope of the invention. It is not intended that the present invention be limited to the details of the illustrated and described embodiments of the invention, except as necessitated by the following claims.

We claim:

1. A Class D audio amplifier circuit comprising
an audio signal input,
a pulse width modulator (PWM) stage for converting the audio input signal to a series of pulses wherein the width of pulses in the series of pulses is representative of the audio input signal,
a switching power output stage having a supply voltage input and being switchable between an "on" state and an "off" state in response to the series of pulses produced by said PWM stage for producing a series of amplified power output pulses corresponding to the series of pulses produced by said PWM stage,
a main voltage supply for providing a voltage at the supply voltage input of said switching power output stage, and wherein the Class D amplifier has a gain determined by said supply voltage input, and
power output stage voltage control means responsive to defined signal conditions of the audio signal input, said power output stage voltage control means being operative to lower the voltage at the supply voltage input of said switching power output stage, and thereby the gain of the Class D amplifier, upon the detection of a defined condition in the audio signal input and to hold the voltage at the supply voltage input in a lowered voltage condition for a period of time wherein the Class D amplifier operates at reduced voltage ("idles") during such defined audio signal input condition.

2. The Class D amplifier circuit of claim 1 wherein the defined signal conditions include a first selected signal threshold level, $L_{off}$, below which the power output stage voltage control means treats the audio signal input as being in an idle state, and wherein upon detection of an idle state signal condition the power output stage voltage control means causes the voltage at the supply voltage input of said switching power output stage to be reduced.

3. The Class D amplifier circuit of claim 2 wherein the power output stage voltage control means treats the audio signal input as being in the idle state after a period of time after the audio input signal falls below $L_{off}$, said period of time being selected to preserve natural pauses in the audio content of the audio signal input.

4. The Class D amplifier circuit of claim 2 wherein the defined signal conditions include a second selected signal threshold level, $L_{on}$, above which the power output stage voltage control means treats the audio input signal as in an active state, and wherein upon detection of an active state signal condition the power output stage voltage control means causes the voltage at the supply voltage input of said switching power output stage to be restored to the voltage provided by the main voltage supply.

5. The Class D amplifier circuit of claim 4 wherein $L_{off}$ is lower than $L_{on}$ to provide a hysteresis between the defined signal conditions.

6. The Class D amplifier circuit of claim 4 wherein said power output stage voltage control means includes means for providing a smooth transition between voltage levels at the supply voltage input of said switching power output stage as voltage at said supply voltage input in reduced upon detection of an idle state of the audio signal input and restored upon detection of an active state of the audio signal input.

7. The Class D amplifier circuit of claim 1 wherein said switching power output stage is an H-bridge power transistor circuit having a single supply voltage input.

8. The Class D amplifier circuit of claim 1 wherein said power output stage voltage control means is inserted between the main voltage supply of the Class D amplifier circuit and the supply voltage input of said switching power output stage.

9. The Class D amplifier circuit of claim 8 wherein said power output stage voltage control means is comprised of a power control transistor having a gate input, and an audio signal input level detector circuit for detecting defined signal conditions of audio input signal and for generating a logic level input for the gate input of said power control transistor, said power control transistor being responsive to the logic level input generated by the audio signal input level detector circuit for reducing and restoring the voltage at the supply voltage input of the switching power output stage.

10. The Class D amplifier circuit of claim 9 wherein said power output stage voltage control means further comprises a gate ramp control circuit for controlling the transitions between voltage levels at the supply voltage input of the switching power output stage produced by said power control transistor.

11. The Class D amplifier circuit of claim 1 further comprising an output filter stage for converting the series of amplified power output pulses to an amplified analog audio signal for driving a loudspeaker.

12. The Class D amplifier circuit of claim 1 further comprising digital signal processing means (DSP) for providing a digital PWM.

13. The Class D amplifier circuit of claim 12 wherein said audio signal input is an analog input and further comprising a analog-to-digital converter (ADC) for converting the analog audio signal input to a digital audio signal.

14. A Class D audio amplifier circuit comprising
an audio signal input,
a pulse width modulator (PWM) stage for converting the audio input signal to a series of pulses wherein the width of pulses in the series of pulses is representative of the audio input signal,
a switching transistor power output stage having a supply voltage input and being switchable between an "on" state and an "off" state in response to the series of pulses produced by said PWM stage for producing a series of amplified power output pulses corresponding to the series of pulses produced by said PWM stage,
a main voltage supply for providing a voltage at the supply voltage input of said switching power output stage,
power output stage voltage control means between the main voltage supply of the Class D amplifier circuit and the supply voltage input of said switching transistor power output stage, said power output stage voltage control means being responsive to defined signal conditions of the audio signal input as follows:
the defined signal conditions include a selected signal threshold level, $L_{off}$,
the power output stage voltage control means treats the audio signal input as being in an idle state after a period of time after the audio input signal falls below $L_{off}$,
the period of time after the audio input signal falls below $L_{off}$ before which the audio signal is treated as being in the idle state is selected to preserve natural pauses in the audio content of the audio signal input, and
upon detection of the idle state signal condition in the audio signal input the power output stage voltage control means causes the voltage at the supply voltage input of said switching power output stage to be reduced, and
an output filter stage for converting the series of amplified power output pulses to an amplified analog audio signal for driving a loudspeaker.

15. The Class D amplifier circuit of claim 14 wherein the defined signal conditions include a second selected signal threshold level, $L_{on}$, above which the power output stage voltage control means treats the audio input signal as in an active state, and wherein upon detection of an active state signal condition the power output stage voltage control means causes the voltage at the supply voltage input of said switching power output stage to be restored to the voltage provided by the main voltage supply.

16. The Class D amplifier circuit of claim 15 wherein $L_{off}$ is lower than $L_{on}$ to provide a hysteresis between the defined signal conditions.

17. The Class D amplifier circuit of claim 16 wherein said power output stage voltage control means includes means for providing a smooth transition between voltage levels at the supply voltage input of said switching power output stage as voltage at said supply voltage input in reduced upon detection of the idle state of the audio signal input and restored upon detection of an active state of the audio signal input.

18. The Class D amplifier circuit of claim 17 wherein said switching transistor power output stage is an H-bridge power transistor circuit having a single supply voltage input.

19. A method of reducing noise in a Class D amplifier having an audio signal input having a signal level, a pulse width modulator (PWM) stage for converting the audio input signal to a series of pulses wherein the width of pulses in the series of pulses is representative of the audio input signal, a switching power output stage having a supply voltage input and being switchable between an "on" state and an "off" state in response to the series of pulses produced by said PWM stage for producing a series of amplified power output pulses corresponding to the series of pulses produced by said PWM stage, and a main voltage supply for providing a voltage at the supply voltage input of said switching power output stage, said method comprising
establishing when an idle state of the audio signal input exists based on the signal level of the audio signal input,
detecting the level of the audio signal input of the Class D amplifier to determine when an idle state of the audio signal input exists, reducing the voltage at the supply voltage input of the switching power output stage of the Class D amplifier upon the detection of the idle state of the audio signal input.

20. The method of claim 19 wherein establishing when the idle state of the audio signal input exists includes waiting for a period of time after the audio input signal falls below a level threshold, $L_{off}$, that preserves natural pauses in the audio content of the audio signal input.

* * * * *